(12) United States Patent
Bouchard

(10) Patent No.: US 9,838,678 B2
(45) Date of Patent: Dec. 5, 2017

(54) ULTRALIGHT SWITCHED-MODE POWER SUPPLY DEVICE AND METHOD OF USE THEREOF

(71) Applicant: GENIX DEVELOPPEMENT INC., Joliette OT (CA)

(72) Inventor: Mathieu Bouchard, Ville d'Anjou (CA)

(73) Assignee: GENIX DEVELOPPEMENT INC., Joliette, QC (CA)

( * ) Notice: Subject to any disclaimer, the term of this patent is extended or adjusted under 35 U.S.C. 154(b) by 339 days.

(21) Appl. No.: 14/720,272

(22) Filed: May 22, 2015

(65) Prior Publication Data

US 2015/0341627 A1 Nov. 26, 2015

Related U.S. Application Data

(60) Provisional application No. 62/001,687, filed on May 22, 2014.

(51) Int. Cl.
*H04N 17/00* (2006.01)
*G01R 31/42* (2006.01)
*H02J 4/00* (2006.01)
*H04N 7/10* (2006.01)

(52) U.S. Cl.
CPC ............ *H04N 17/00* (2013.01); *G01R 31/42* (2013.01); *H02J 4/00* (2013.01); *H04N 7/102* (2013.01); *Y10T 307/696* (2015.04)

(58) Field of Classification Search
CPC ......... H02J 4/00; H04N 7/102; Y10T 307/696
USPC ....................................................... 307/150
See application file for complete search history.

(56) References Cited

PUBLICATIONS

Intelligent Cable UPS Technical Manual XM2, XM2-HV, XM2-HP (Nov. 2010).

*Primary Examiner* — Robert Deberadinis
(74) *Attorney, Agent, or Firm* — C. Marc Benoit; Benoit & Cote inc.

(57) ABSTRACT

The present document describes a method for analyzing the performance of a leg of a cable communication network which uses a network power supply as the power source therefor, the method using a switched-mode power supply device and comprising: electrically connecting an AC output of the switched-mode power supply device to an auxiliary power input of a cable network access device thereby providing an electrical connection to the leg of the cable communication network; switching the power source from the network power supply to the switched-mode power supply thereby providing an AC voltage to the leg of the cable communication network by the switched-mode power supply; performing a diagnosis of the performance of the leg of a cable communication network by controlling a characteristic of the AC voltage being provided to the leg of the cable communication network by the switched-mode power supply.

20 Claims, 12 Drawing Sheets

ULTRALIGHT SWITCHED-MODE POWER SUPPLY DEVICE AND METHOD OF USE THEREOF

CROSS-REFERENCE TO RELATED APPLICATIONS

This application claims priority under 35 USC §119(e) of U.S. provisional patent application No. 62/001,687, filed on May 22, 2014, the specification of which is hereby incorporated by reference.

BACKGROUND (a) Field

The subject matter disclosed generally relates to power supply devices and to methods for analyzing cable communication networks. More particularly, the subject matter relates to switched-mode power supply devices for connection to cable network access devices (outdoor cable network access devices) of cable communication networks and to methods for analyzing the performance of legs of cable communication networks.

(b) Related Prior Art

A power supply device is a device that supplies electric power to an electrical load. The term is most commonly applied to electric power converters that convert one form of electrical energy to another. A regulated power supply is one that controls the output voltage or current to a specific value, the controlled value is held nearly constant despite variations in either load current or the voltage supplied by the power supply's energy source.

Every power supply must obtain the energy it supplies to its load, as well as any energy it consumes while performing that task, from an energy source. Depending on its design, a power supply may obtain energy from electrical energy transmission systems. Common examples of this include power supplies that convert AC line voltage to DC voltage.

A power supply may be implemented as a discrete, stand-alone device or as an integral device that is hardwired to its load.

Commonly specified power supply attributes include, without limitation, the amount of voltage and current it can supply to its load, how stable its output voltage or current is under varying line and load conditions, how long it can supply energy without refueling or recharging (i.e., applies to power supplies that employ portable energy sources), and the like.

Power supplies for electronic devices can be broadly divided into line-frequency (i.e., or "conventional") and switching power supplies. The line-frequency supply is usually a relatively simple design, but it becomes increasingly bulky and heavy for high-current equipment due to the need for large mains-frequency transformers and heat-sinked electronic regulation circuitry. A switched-mode supply of the same rating as a line-frequency supply will be smaller, is usually more efficient, but would be more complex.

In a switched-mode power supply (i.e., SMPS), the AC mains input is directly rectified and then filtered to obtain a DC voltage. The resulting DC voltage is then switched on and off at a high frequency by electronic switching circuitry, thus producing an AC current that will pass through a high-frequency transformer or inductor. Switching occurs at a very high frequency (i.e., typically 10 kHz-1 MHz), thereby enabling the use of transformers and filter capacitors that are much smaller, lighter, and less expensive than those found in linear power supplies operating at mains frequency. After the inductor or transformer secondary, the high frequency AC is rectified and filtered to produce the DC output voltage. If the SMPS uses an adequately insulated high-frequency transformer, the output will be electrically isolated from the mains; this feature is often essential for safety.

Thus, technicians working on a cable communication network (for example analyzing legs of cable communication networks) usually need to manipulate a plurality of heavy instruments and a lot of materials when they climb in electrical posts at heights of 25 foot and over. The technicians furthermore often need to stay up in the air while taking some measurements on the cable communication network as such equipment cannot remain about an outdoor cable network access device by its own. This can result in non-productive operations and injuries.

Furthermore, the power supplies required on cable communication networks become increasingly bulky and heavy for high-current equipment due to the need for large mains-frequency transformers and heat-sinked electronic regulation circuitry.

There is therefore a need for improved switched-mode power supply devices to overcome the prior art disadvantages and for improved methods of analyzing legs of cable communication networks.

SUMMARY

According to an embodiment, there is provided a method for analyzing a performance an AC power signal on a leg of a cable communication network which uses a network power supply as a power source therefor, the method using a switched-mode power supply and comprising:
  electrically connecting an AC output of the switched-mode power supply to an auxiliary power input of a cable network access device thereby providing an electrical connection of the switched-mode power supply to the leg of the cable communication network;
  switching the power source from the network power supply to the switched-mode power supply thereby providing an AC voltage to the leg of the cable communication network by the switched-mode power supply;
  performing a diagnosis of the performance of the AC power signal on the leg of the cable communication network by controlling a characteristic of the AC voltage being provided to the leg of the cable communication network by the switched-mode power supply.

According to an aspect, the method further comprises:
  locating the cable network access device providing access to the leg of the cable communication network;
  locating an electrical power source in an immediate vicinity of the cable network access device; and
  electrically connecting the switched-mode power supply to the electrical power source.

According to an aspect, the performing a diagnosis comprises varying the AC voltage of the power source of the switched-mode power supply and measuring, on the switched-mode power supply, a current on the leg of the cable communication network.

According to an aspect, the method further comprises measuring when the current is outside of a given threshold and determining, from the measuring, an AC voltage limit which will result in the current being outside of the given threshold.

According to an aspect, the method further comprises:
  identifying which electrical equipment at an end of the leg of the cable communication network has gone offline; and
  performing one of:
    electrically connecting the identified equipment to an alternate power source; and
    replacing the network power supply with one which provides a higher level of AC voltage.

According to an aspect, the performing a diagnosis comprises:
  setting, on the switched-mode power supply, a frequency of the AC voltage provided on the leg of the cable communication network at a given frequency which is different from a frequency which is used as a standard for the cable communication network;
  measuring a frequency of the AC voltage at various cable network access devices on the cable communication network; and
  determining that, when a frequency measured at a cable network access device is the same as the given frequency, the cable network access device belongs to the same leg of the cable communication network as the cable network access device at which the given frequency was set.

According to an aspect, the performing a diagnosis comprises:
  determining that an AC voltage level is below a given threshold at the cable network access device; and
  using the switched-mode power supply to step up the AC voltage to a level such that electrical equipment electrically downstream from the cable network access device on the leg of the cable communication network will stay online and perform their intended function.

According to an aspect, the performing a diagnosis comprises taking a reading of at least one of an AC voltage level, a current, and a frequency of the AC voltage.

According to an aspect, the taking a reading is performed on the switched-mode power supply.

According to an aspect, the taking a reading is performed on another device which is electrically connected to another cable network access device on the cable communication network.

According to an embodiment, there is provided a method for analyzing a performance an electrical equipment having a requirement for an AC power signal on a leg of a cable communication network which uses a network power supply as a power source therefor, the method using a switched-mode power supply and comprising:
  mechanically installing the electrical equipment on the leg of the cable communication network;
  electrically connecting an input of the switched-mode power supply to a portable battery providing a DC power source;
  the switched-mode power supply performing as an inverter to convert the DC power source to an AC power signal;
  prior to electrically connecting the electrical equipment to the network power supply, electrically connecting an AC output of the switched-mode power supply to the electrical equipment thereby providing an AC power signal to the electrical equipment; and
  performing a diagnosis of the performance of the electrical equipment while using the switched-mode power supply as the power source for the electrical equipment.

According to an embodiment, there is provided a switched-mode power supply device for connection to an outdoor cable network access device of a cable communication network for analyzing a performance an AC power signal on a leg of the cable communication network which uses a network power supply as a power source therefor, the power supply device comprising:
  a power source connection for electrically connecting to an external electrical power source providing an input power signal which comprises either an alternating current (AC input signal) or a direct current (DC input signal);
  a programmable variable power output which:
    when the input power signal comprises an AC input signal, converts the AC input signal to an AC output signal different from the AC input signal for output on the cable communication network;
    when the input power signal comprises a DC input signal, inverts the DC input signal to an AC output signal for output on the cable communication network;
    is electrically connected to an auxiliary power input of a cable network access device thereby providing an electrical connection of the switched-mode power supply device to the leg of the cable communication network and hence the AC output signal to the cable network access device; and
    controls a characteristic of the AC output signal being provided to the leg of the cable communication network for performing a diagnosis of the performance of the AC power signal on the leg of the cable communication network.

According to an aspect, the device further comprises a sealed casing for sealingly receiving the power source connection and the programmable variable power output thereby preventing water or other contaminants from entering the sealed casing.

According to an aspect, the device further comprises an attachment member extending from the sealed casing and adapted to attach securely the power supply device to a cable near the outdoor cable network access device.

According to an aspect, the device a heat dissipation device mounted about the sealed casing for dissipating heat from the sealed casing.

According to an aspect, the attachment member comprises a first attachment member upwardly extending from the sealed casing and a second attachment member distant from the first attachment member and upwardly extending from the sealed casing.

According to an aspect, each one of the first and second attachment members comprises at least one of: a strap, a chain, a loop member and a hook portion.

According to an aspect, the device a current monitor for monitoring a current on the leg of the cable communication network.

According to an aspect, the device a frequency monitor for monitoring at least one of: the AC input signal, the DC input signal and the AC output signal.

According to an aspect, the power supply device has a weight of less than 5 kg.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

In embodiments, there are disclosed ultralight switched-mode power supply devices for connection to cable network access devices (such as outdoor cable network access devices) of cable communication networks and methods for analyzing performance of legs or a portion (or portions) of a network of cable communication networks.

It should be noted that, according to an embodiment, the electrical equipment installed on the legs of the cable communication network and which are the subject of the analysis are installed in series. The electrical equipment are those which require an AC power signal to stay online and perform their intended function(s).

In the description below, it is to be noted that the term "controlling" could also be interchanged with terms such as, without limitation, "varying", "changing", "adjusting" and the like.

Figure 1:
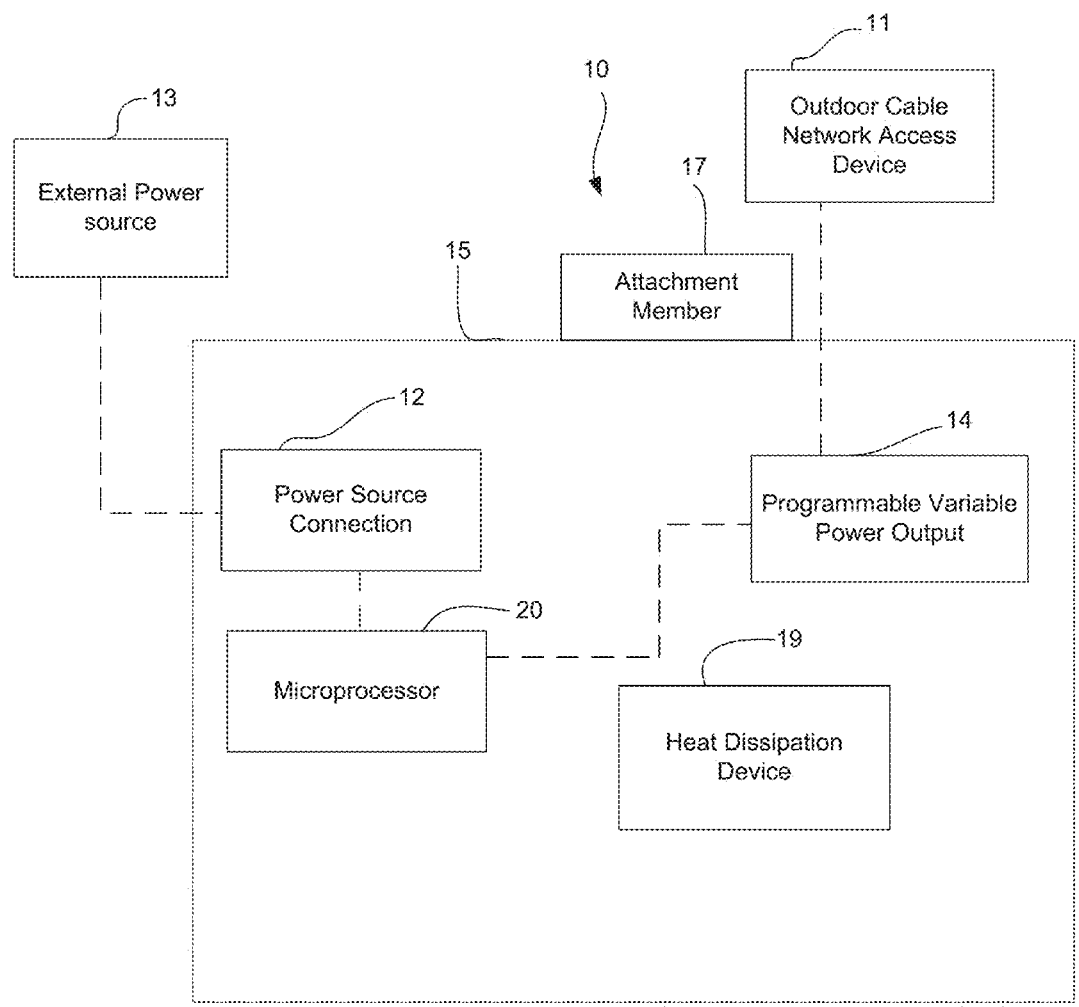
FIG. 1 is a bloc diagram of an ultralight switched-mode power supply device in accordance with an embodiment.
Figure 2:
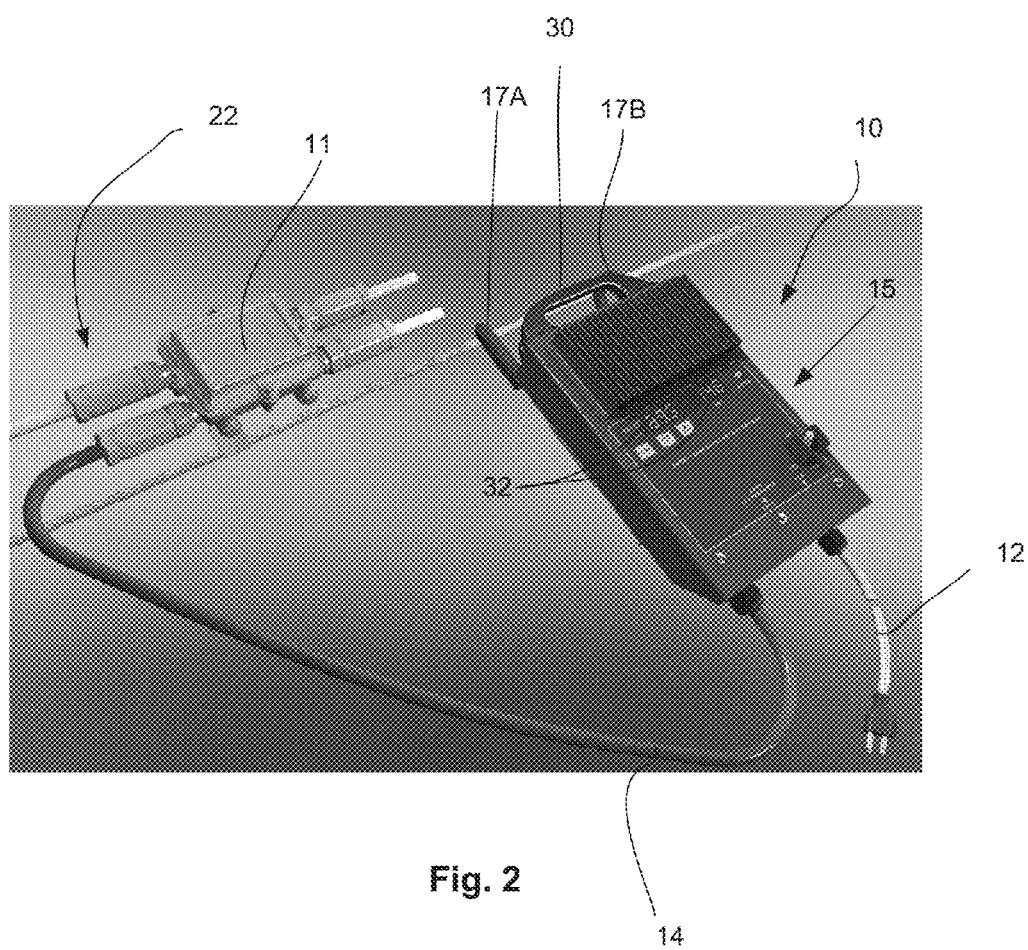
FIG. 2 is a perspective view of an ultralight switched-mode power supply device in connection to an outdoor cable network access device of a cable communication network in accordance with another embodiment.

Referring now to the drawings, and more particularly to FIGS. 1-4, there is shown an ultralight switched-mode power supply device 10 to be connected to a cable network access device 11, such as an outdoor cable network access device 11 of a cable communication network 22 (FIG. 2). The device 10 includes a power source connection 12 to be electrically connected to an external power source 13. The external power source 13 provides an input power signal which comprises either an alternating current (i.e., AC input signal) or a direct current (DC input signal). The device 10 further includes a programmable variable power output 14. When the input power signal comprises an AC input signal, the programmable variable power output 14 converts the AC input signal to an AC output signal different from the AC input signal for outputting on the cable communication network 22. On the other hand, when the input power signal comprises a DC input signal, the programmable variable power output 14 inverts the DC input signal to an AC output signal for outputting on the cable communication network 22. The device 10 also includes a sealed casing 15 responsible of sealingly receiving the power source connection 12 and the programmable variable power output 14 in a way to prevent water or other contaminants and/or elements, such as, without limitation, leaves, snow, debris and the like, to enter the sealed casing 15.

The device 10 also includes an attachment member 17 which extends from the sealed casing 15 and which is adapted to attach securely the device 10 to a cable near the cable network access device 11. The attachment member 17 is configured such as to help the technician to hang the device 10 on the cable communication network 22 while he is performing his task(s), for example, when he is analyzing the legs of the cable communication network 22.

The device 10 further includes a heat dissipation device 19 (FIG. 1) mounted about the sealed casing 15 for dissipating heat from the sealed casing 15.

Still referring to FIG. 1, there is shown that the device 10 further includes a microprocessor 20 which is operatively coupled to the power source connection 12 and the programmable variable power output 14. The microprocessor 20 is configured to control the operation of the programmable variable power output 14.

Figure 3:
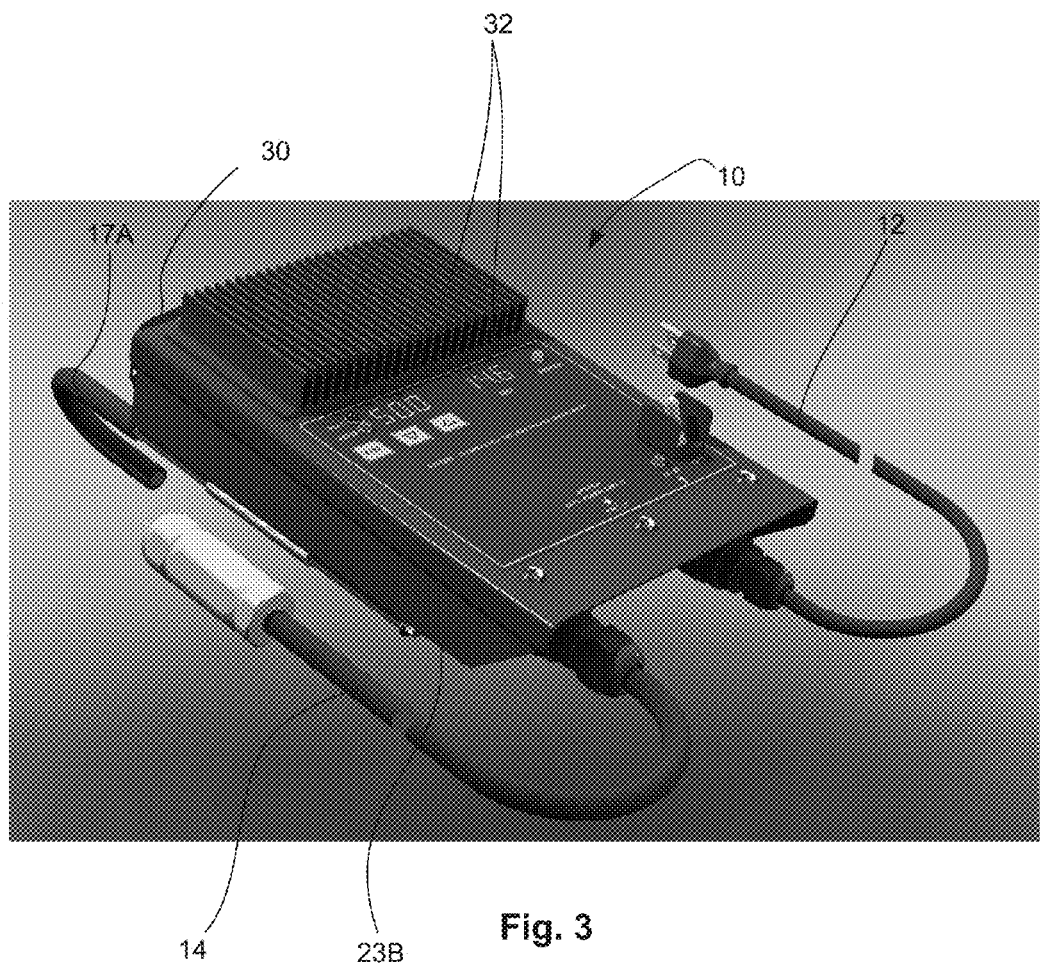
FIG. 3 is another perspective view of the ultralight switched-mode power supply device of FIG. 2 for connection to the outdoor cable network access device of the cable communication network.
Figure 4:
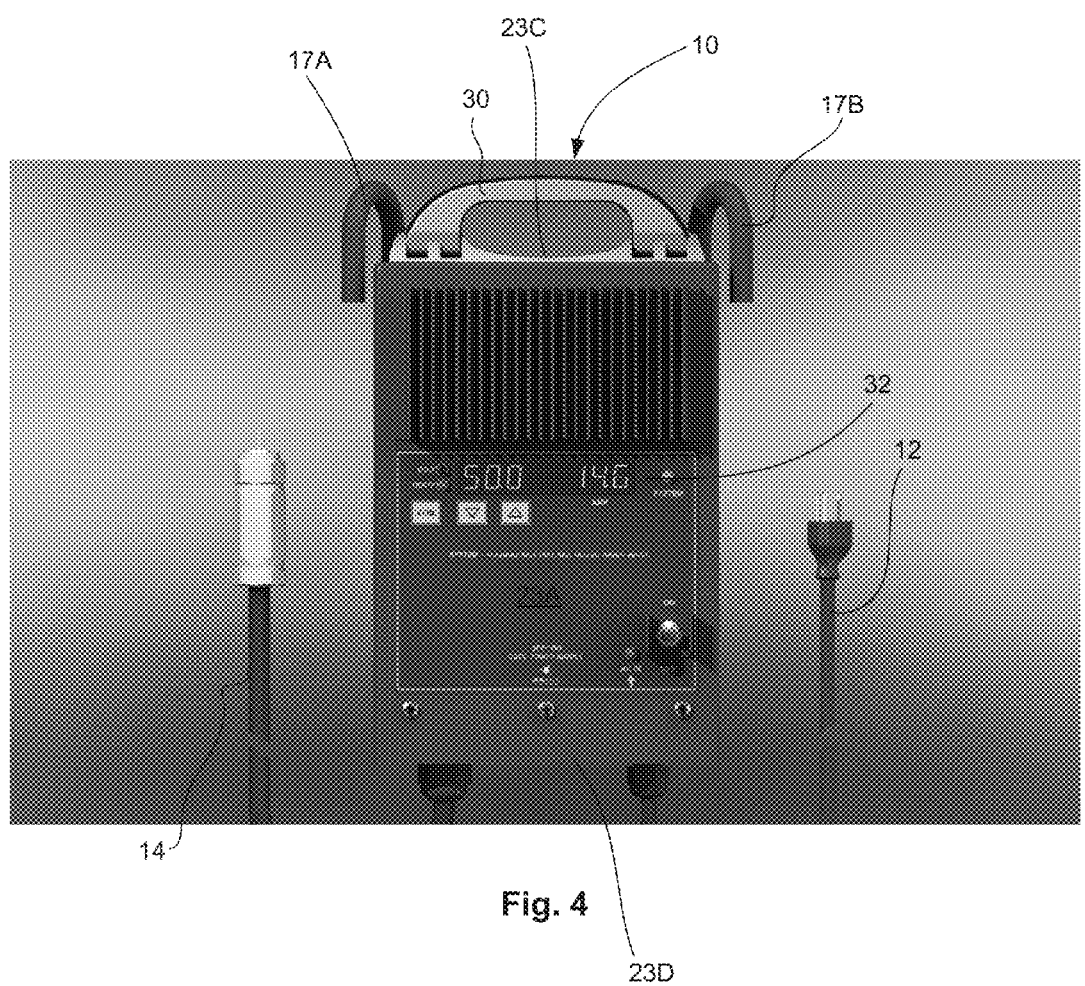
FIG. 4 is a front elevation view of the ultralight switched-mode power supply device of FIG. 2 for connection to the outdoor cable network access device of the cable communication network.

Now referring to FIGS. 2-4, there is shown that the sealed casing 15 of the device 10 includes a front wall 23A, a rear wall 23B, a top wall 23C and a bottom wall 23D. The attachment member 17 shown in FIG. 1 includes a first attachment member 17A (FIG. 4) which upwardly extends from the top wall 23C of the sealed casing 15 and a second attachment member 17B which is distant from the first attachment member 17A and which also upwardly extends from the top wall 23C of the sealed casing 15. Each one of the first and second attachment members 17A, 17B may include a strap, a chain, a loop member and/or a hook portion. As best shown in FIGS. 2-4, the first and second attachment members 17A, 17B each include hook portions such as to help the technician in hanging the device to a cable of the cable communication network 22.

The device 10 further includes a current monitor for monitoring the AC input signal, the DC input signal and/or the AC output signal.

The device 10 further includes a frequency monitor (not shown) for monitoring the AC input signal, the DC input signal and/or the AC output signal.

It is to be noted that the external power source 13 (shown in FIG. 1) may be represented by a battery power source (within the device 10 or about the device 10) and/or by a permanently installed power source (i.e., XN2) that is directly provided on the cable communication network 22. Such a battery power source may be needed for permanent installation of the device 10 on the cable communication network 22. Otherwise, a battery power source is not needed as the device 10 may be plugged on the permanently installed power source that is provided on the cable communication network 22 (so that the technician can let the device 10 hung up on the cable for a long period of time to perform his analysis of the legs of the cable communication network 22).

The microprocessor 20 controls the operation of the programmable variable power output 14 such as to automatically change the characteristics of the output signal, as a function of time for example.

Accordingly, a first state of the device 10 may include a standard state, where the microprocessor 20 controls the programmable variable power output 14 to output a power signal (the output signal) of a predetermined standard value.

On the other hand, a second state of the device 10 may include an adaptive state, where the microprocessor 20 is configured to sense the power needs of a load coupled to the programmable variable power output 14 and to control the programmable variable power output 14 to output a power signal (the output signal) suitable for the power needs of the sensed load.

The device 10 may further include a handle 30 for allowing easy transportation of the device 10. Moreover, the device 10 further includes an output interface 30 for posting the required information to the technician on site.

Figure 5:
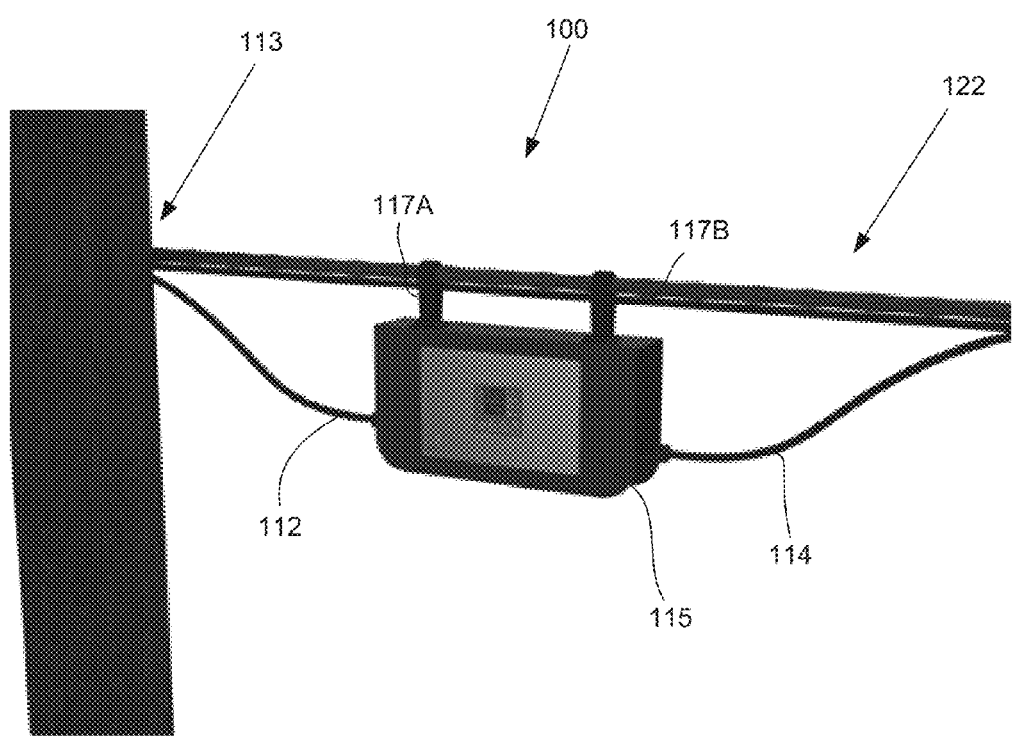
FIG. 5 is a perspective view of an ultralight switched-mode power supply device in connection to an outdoor cable network access device of a cable communication network in accordance with another embodiment.
Figure 6:
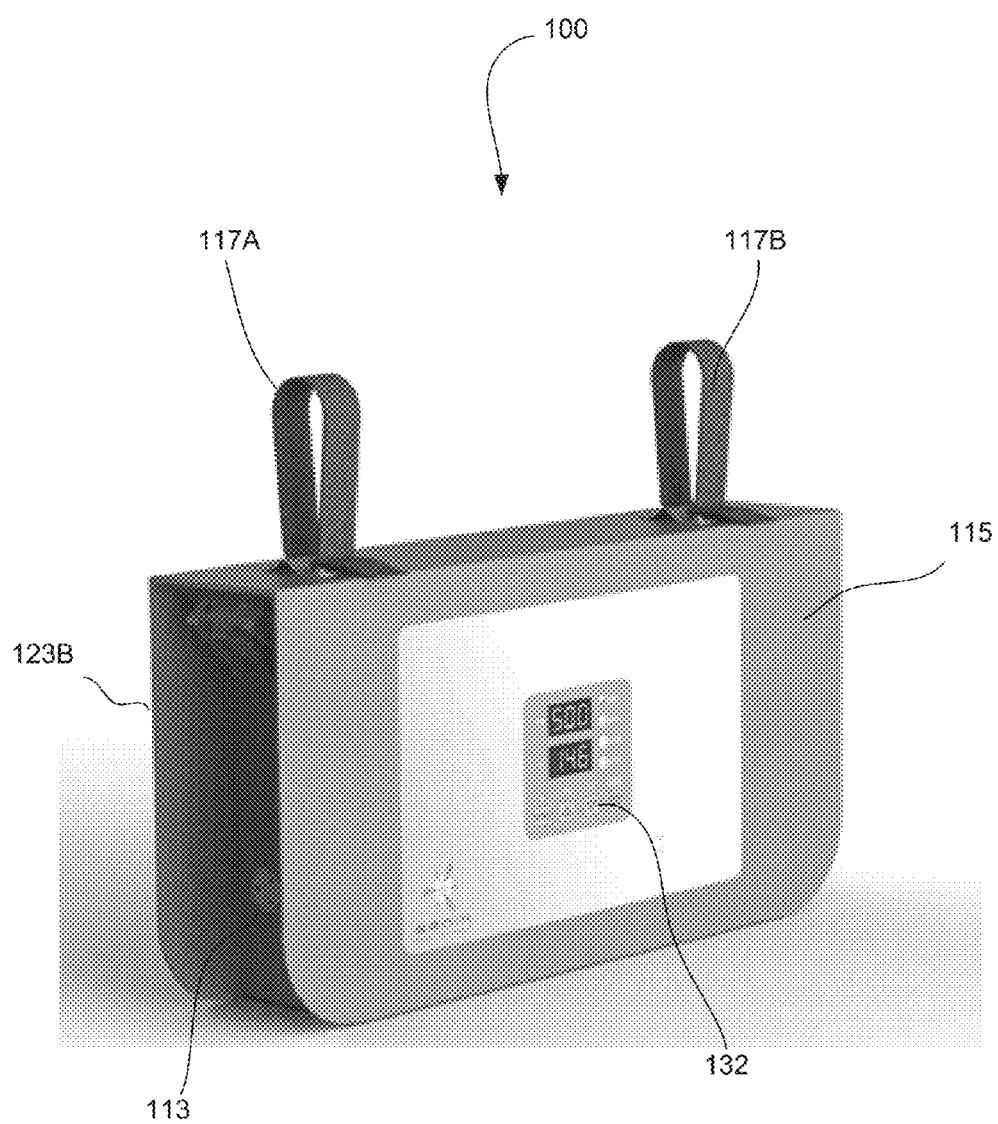
FIG. 6 is another perspective view of the ultralight switched-mode power supply device of FIG. 5 for connection to the outdoor cable network access device of the cable communication network, showing its attachment members.
Figure 7:
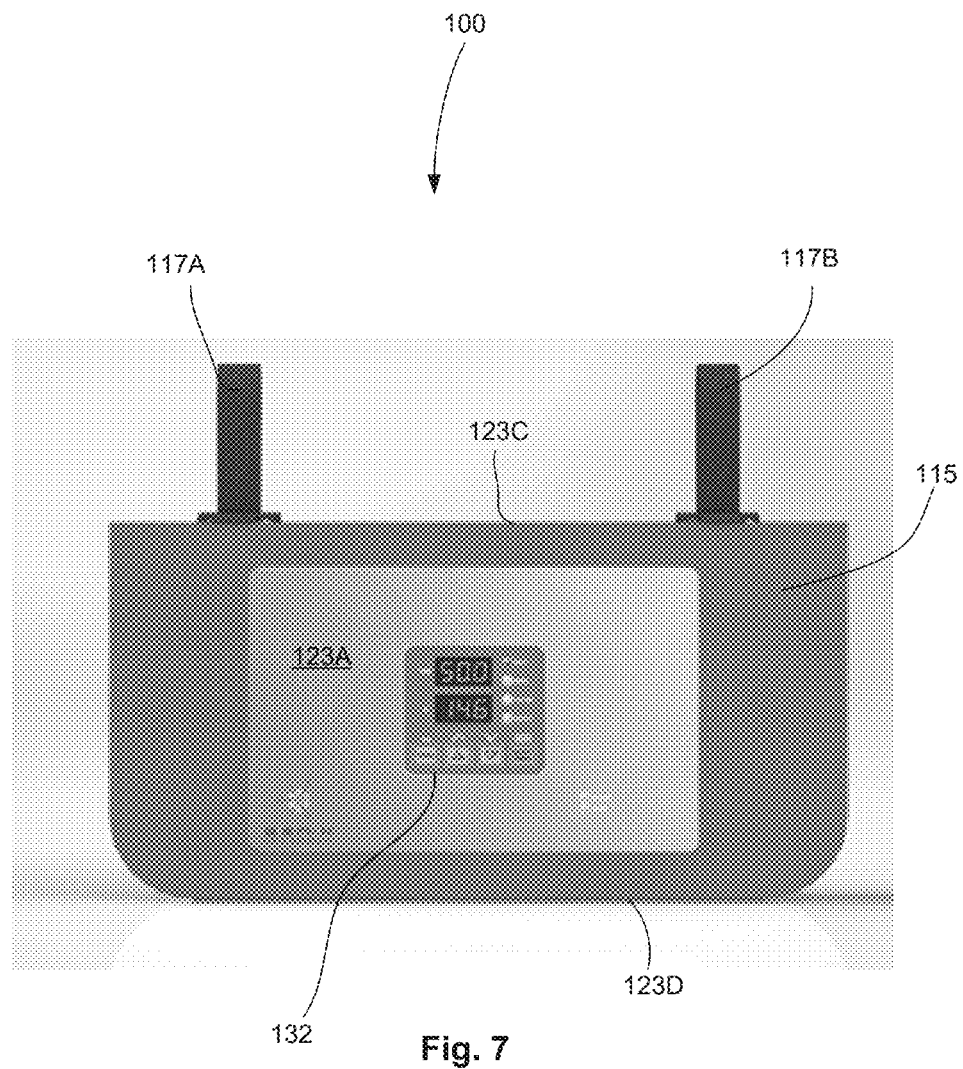
FIG. 7 is a front elevation view of the ultralight switched-mode power supply device of FIG. 5 for connection to the outdoor cable network access device of the cable communication network.

According to another embodiment and referring now to FIGS. 5-7, there is shown an ultralight switched-mode power supply device 100 to be connected to an outdoor cable network access device 11 (FIG. 2) of a cable communication network 122. The device 100 includes a power source connection 112 to be electrically connected to an external power source 113. As mentioned above, the external power source 113 provides the input power signal which comprises either the alternating current (i.e., AC input signal) or the direct current (DC input signal). The device 100 further includes a programmable variable power output 114. When the input power signal comprises an AC input signal, the programmable variable power output 114 converts the AC input signal to an AC output signal different from the AC input signal for output on the cable communication network 122. On the other hand, when the input power signal comprises a DC input signal, the programmable variable power output 114 inverts the DC input signal to an AC output signal for outputting on the cable communication network 122. The device 100 also includes a sealed casing 115 responsible of sealingly receiving the power source connection 112 and the programmable variable power output 114 in a way to prevent water or other contaminants and/or elements, such as, without limitation, leaves, snow, debris and the like, to enter the sealed casing 115.

The device 100 shown in FIGS. 5-7 also includes attachment members 117A, 117B which extend from the sealed casing 115 and which are adapted to attach securely the device 100 to a cable near the outdoor cable network access device 11 (FIG. 2) of the cable communication network 122. The attachment members 117A, 117B are configured such as to help the technician to hang the device 100 on the cable communication network 122 while he is performing his task(s) (i.e., while he is analyzing the performance of the legs of the cable communication network 122).

Still referring to FIGS. 5-7, there is shown that the sealed casing 115 of the ultralight switched-mode power supply device 100 includes a front wall 123A, a rear wall 123B, a top wall 123C and a bottom wall 123D. The first attachment member 117A upwardly extends from the top wall 123C of the sealed casing 115 while the second attachment member 117B, which is distant from the first attachment member 117A, also upwardly extends from the top wall 123C of the sealed casing 115. As best shown in FIG. 6, the first and second attachment members 117A, 117B each include a strap which can be securely fixed to the cable of the cable communication network 122 about the external power source 13 (FIG. 1). It is to be mentioned that the attachment members 117A, 117B may take any other suitable form or shape and may extend from any other places from the sealed casing 115, such as to allow a secured attachment of the device 100 to a cable of the cable communication network 122 near the external power source.

The devices 10, 100 are capable of providing an adjustable frequency.

According to another embodiment, the devices 10, 100 weighs less than 5-10 kg. More particularly, the devices 10, 100 weighs about 4 kg.

According to another embodiment, the input voltage of the devices 10, 100 may be from about 60 to about 220 Vac (i.e., Voltage in Alternative Current).

According to another embodiment, the output voltage of the devices 10, 100 may be from about 60 to about 90 Vac, which may be adjustable.

According to another embodiment, the output frequency of the devices 10, 100 may be from about 50 Hz to about 70 Hz, which may be adjustable.

According to another embodiment, the maximal power of the devices 10, 100 may be about 1500 W at 90 Vac.

The adjustable output frequency of the devices 10, 100 allows validation, tracking and reconstitution (i.e., real implementation vs. planed implementation) of an AC supply circuit in the cable communication network 22, 122.

The devices 10, 100 further facilitate the displacement of an auxiliary source in electric posts at heights of 25 feet and over. The devices 10, 100 are therefore useful to increase the security of the technicians on site.

The devices 10, 100 may be used in a plurality of applications where the use of an auxiliary AC source is needed, as it will be described below.

According to another embodiment, the devices 10, 100 may further include a wireless communication device (not shown) for communicating the data (the current and the frequency) to a wireless communication receptor so that if the technician is not close to the device 10 or 100, he would still be able to receive the data (in his truck for example, or directly at the central office).

Figure 8:
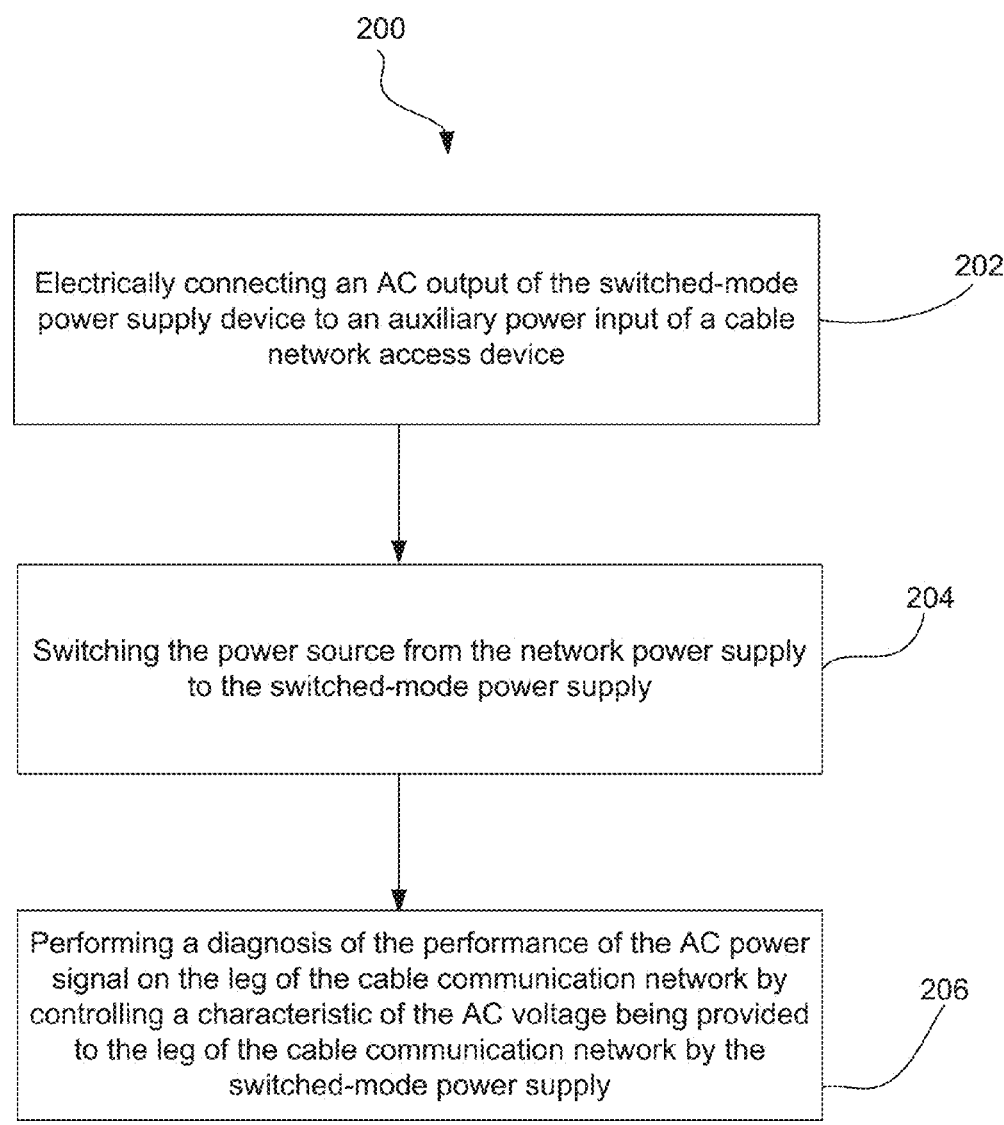
FIG. 8 is a flow chart of a method for analyzing the performance of a leg of a cable communication network in accordance with another embodiment.

According to another embodiment, and referring now to FIG. 8, there is shown a flow chart of a method 200 for analyzing the performance of a leg of a cable communication network which uses a network power supply as the power source therefor. The method 200 uses a switched-mode power supply device (10, 100). The method 200 comprises the step 202 of electrically connecting an AC output of the switched-mode power supply device to an auxiliary power input of a cable network access device, thereby providing an electrical connection to the leg of the cable communication network. The method 200 further includes the step 204 of switching the power source from the network power supply to the switched-mode power supply.

Step 204 provides an AC voltage to the leg of the cable communication network by the switched-mode power supply.

The method 200 also includes step 206 of performing a diagnosis of the performance of the leg of a cable communication network by controlling a characteristic of the AC voltage being provided to the leg of the cable communication network by the switched-mode power supply. Indeed, step 206 may, for example, performing at least one of: measuring the current on the leg of the cable communication network while varying the AC voltage of the power source of the switched mode power supply and measuring the frequency of the AC voltage on the leg of the cable communication network while varying the frequency of the AC voltage of the power source of the switched-mode power supply.

According to another embodiment, the step 206 of performing the diagnosis may include the step of taking a reading of an AC voltage level, a current, and/or a frequency of the AC voltage.

According to another embodiment, taking the reading may be performed on the switched-mode power supply.

According to another embodiment, taking the reading may be performed on another device, which is electrically connected to another cable network access device on the cable communication network.

According to another embodiment, the method 200 may further include the step locating the cable network access device providing access to the leg of the cable communication network. The method 200 may further include the step of locating an electrical power source in the immediate vicinity of the cable network access device. The method 200 may further include the step of electrically connecting the switched-mode power supply device to the electrical power source.

It is to be mentioned that immediate vicinity of the cable network access device is less than 3 meters in an embodiment.

Still according to an embodiment, the electrical power source can be an AC or a DC power source. In the circumstance where the power source is a DC power source, the switched-mode power supply will act as an inverter to change the DC voltage at the input of the switched-mode power supply to an AC voltage at the output thereof. The AC power source can be the electrical utility power outlet from an operator which is different from the operator of the cable communication network operator."

According to another embodiment, the step of performing the diagnosis may include varying the AC voltage of the power source of the switched-mode power supply and measuring, on the switched-mode power supply, the current on the leg of the cable communication network.

According to another embodiment, the method may further include the step of measuring when the current is outside of a given threshold and determining, from the measuring, the AC voltage limit which will resulting in the current being outside of the threshold.

Figure 12:
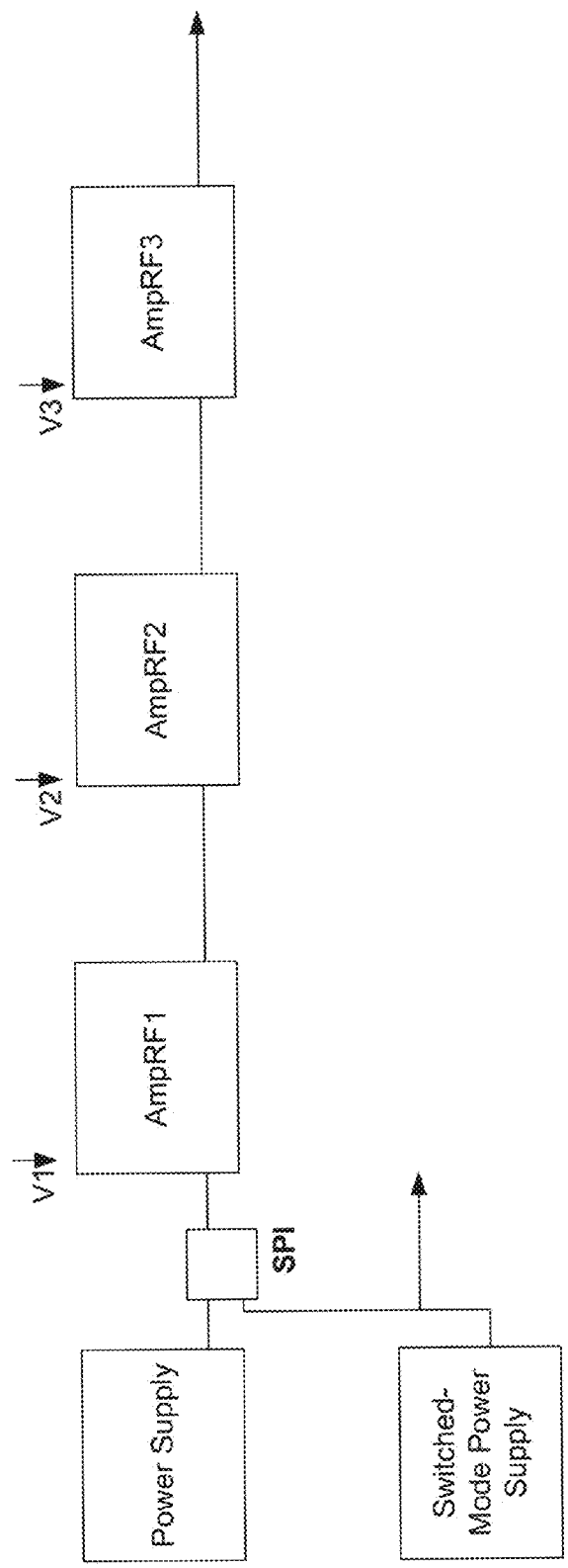
FIG. 12 is a block diagram of another application of the method for analyzing the performance of a leg of a cable communication network shown in FIG. 8, in accordance with another embodiment.

As shown in the application of FIG. 12, the switched-mode power supply is connected to the external/initial power supply and the AC voltage of the power source of the switched-mode power supply is varied, so that it is possible to measure, on the switched-mode power supply, the current on the leg of the cable communication network. In other words, when the current of the leg varies, then one equipment electrically downstream of the switched-mode power supply could be down or offline.

According to another embodiment, the step 206 of performing a diagnosis may include setting, on the switched-mode power supply, a frequency of the AC voltage provided on the leg of the cable communication network at a given frequency which is different from a frequency which is used as a standard for the cable communication network. The step 206 of performing the diagnosis may further include measuring a frequency of the AC voltage at various cable network access devices on the cable communication network. The step 206 of performing a diagnosis may further include determining that, when a frequency measured at a cable network access is the same as the given frequency, the cable network access belongs to the same leg of the cable communication network as the cable network access at which the given frequency was set.

According to another embodiment, the step 206 of performing a diagnosis of the performance of the AC power signal on the leg of the cable communication network by controlling a characteristic of the AC voltage being provided to the leg of the cable communication network by the switched-mode power supply.

Figure 11:
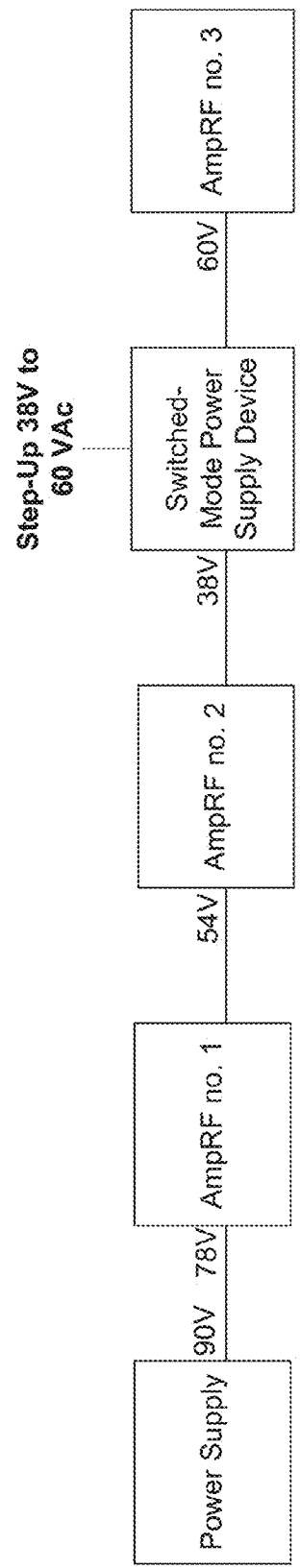
FIG. 11 is a block diagram of an application of the method for analyzing the performance of a leg of a cable communication network shown in FIG. 8, in accordance with another embodiment.

As shown in the application of FIG. 11, when it is determined that an AC voltage level is below a given threshold at the cable network access device (in this example the AC voltage level is shown to decrease from 90 Vac starting at the initial power supply, to 78 Vac at a first equipment, to 54 Vac at a second equipment, to 38 Vac at the entrance of the switched-mode power supply device 10, 100), the switch-mode power supply will here be used to step up the AC voltage to a level such that the electrical equipment electrically downstream from the cable network access device on the leg of the cable communication network will stay online and perform its intended function (in this example, the AC voltage level is increased to 60 Vac so that the third equipment on the line will stay online).

According to a further embodiment, the devices 10, 100 may be used as a supplementary power supply in the cable communication network, such as to provide an additional AC voltage to the cable communication network.

Figure 9:
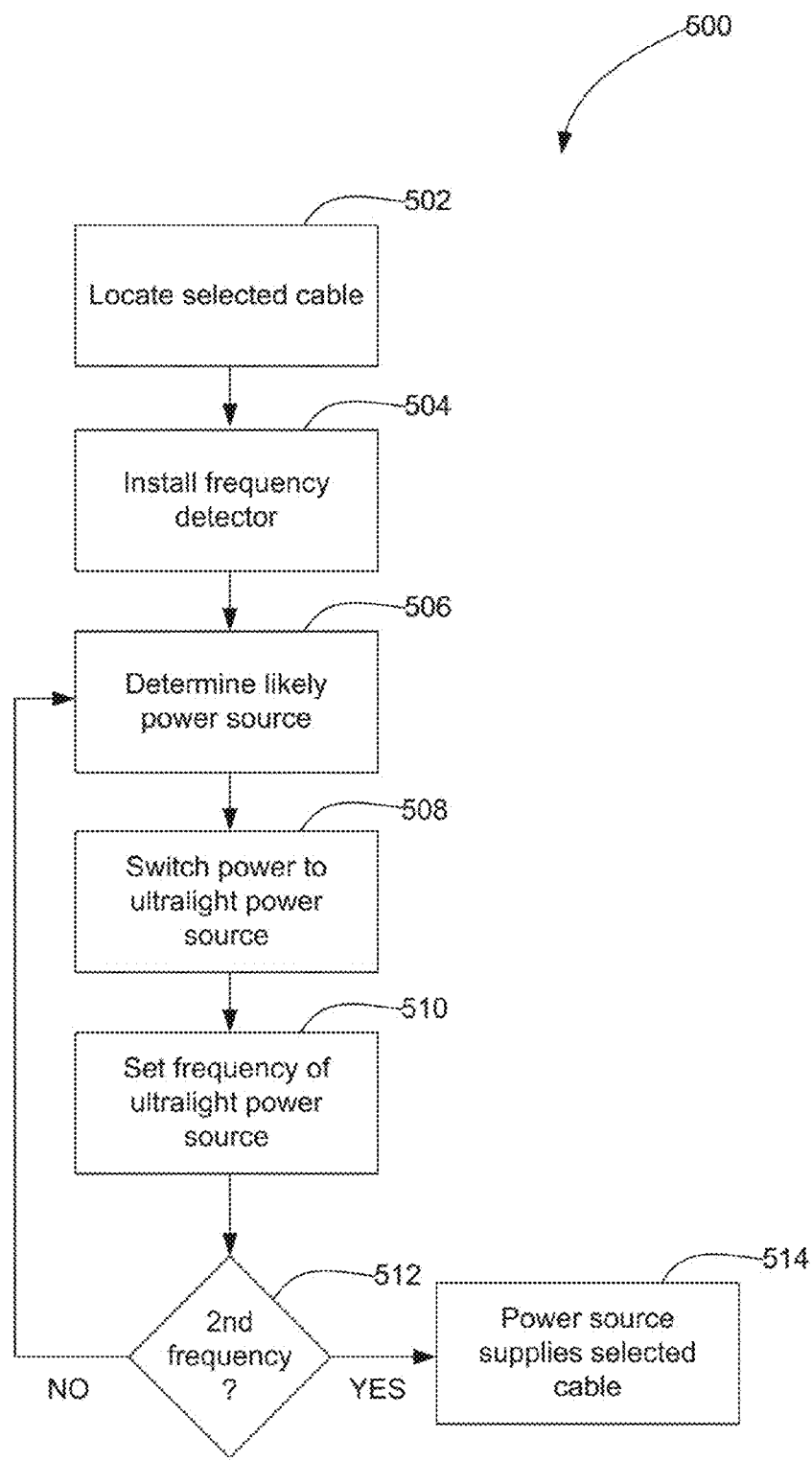
FIG. 9 is a flow chart of a method for detecting which power source supplies power on a CATV network in accordance with an embodiment.

According to another embodiment, and referring now to FIG. 9, there is disclosed a method 500 for detecting which power source supplies power on a CATV network using an ultralight switched-mode power supply device 10, 100. The CATV network comprises cables and nodes and the power source is set at a first frequency. The method 500 comprises:
  locating a selected cable of the CATV network (step 502);
  installing a frequency detector to detect a frequency of the power signal on the selected cable (step 504);
  determining a power source which is likely to be supplying power on the selected cable (step 506);
  switching power from the power source to the ultralight switched-mode power source 10, 100 (step 508);
  setting a frequency of the ultralight switched-mode power source 10, 100 at a second frequency different from the first frequency (step 510);
  detecting whether the frequency of the power signal on the selected cable is the first frequency or the second frequency (step 512); and
  if the frequency is the second frequency, concluding that the power source supplies power to the selected cable (step 514) and if the frequency is the first frequency repeating the determining, switching and setting until the power source supplying the selected cable is found.

Figure 10:
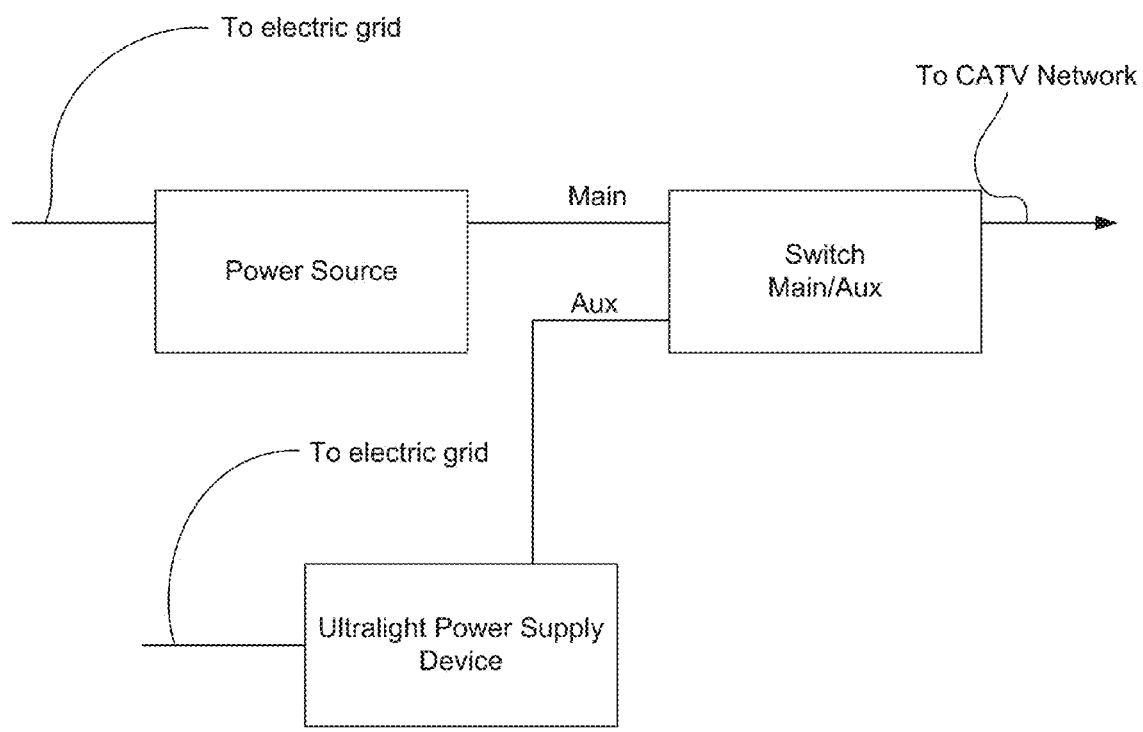
FIG. 10 is a block diagram of a power connection scheme for the cable communication network in accordance with another embodiment.

According to another embodiment, FIG. 10 is a block diagram of a power connection scheme for the cable communication network 22, 122 in accordance with another embodiment. As shown, the ultralight switched-mode power supply device 10, 100 is connected to a main or an auxiliary switch of a device (i.e., such as a VINS) on the cable communication network 22, 122 which connects the CATV network and the electric grid.

According to the devices 10, 100 and the methods described above, it is to be mentioned that the portative power supply device, which may be used periodically by a CATV technician, may also be used permanently as a permanent power supply (alpha power supply) in a cable communication network (mounted about the post) or alternatively as an underground power supply, when the cable network access devices are found to be underground, and not in posts of cable communication networks. It is the case in improved cable communication networks that are underground for aesthetic purposes. In this case where the network is underground, the space is reduced in the cable network access devices, where are enclosed the power supplies.

The devices 10, 100 described above are not only light in weight, but are also really compact as a switched-mode power supply is used in their designs, which are performant and in which magnetic circuitries are optimized.

As mentioned above, the devices 10, 100 and the methods described above may be used for maintenance requirements, trouble-shooting requirements and modernization requirements of a cable communication network.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A method for analyzing a performance of an AC power signal on a leg of a cable communication network which uses a network power supply as a power source therefor, the method using a switched-mode power supply and comprising:
    electrically connecting an AC output of the switched-mode power supply to an auxiliary power input of a cable network access device thereby providing an electrical connection of the switched-mode power supply to the leg of the cable communication network;
    switching the power source from the network power supply to the switched-mode power supply thereby providing an AC voltage to the leg of the cable communication network by the switched-mode power supply;
    performing a diagnosis of the performance of the AC power signal on the leg of the cable communication network by controlling a characteristic of the AC voltage being provided to the leg of the cable communication network by the switched-mode power supply.

2. The method of claim 1, further comprising:
    locating the cable network access device providing access to the leg of the cable communication network;
    locating an electrical power source in an immediate vicinity of the cable network access device; and
    electrically connecting the switched-mode power supply to the electrical power source.

3. The method of claim 1, wherein performing a diagnosis comprises varying the AC voltage of the power source of the switched-mode power supply and measuring, on the switched-mode power supply, a current on the leg of the cable communication network.

4. The method of claim 3, further comprising measuring when the current is outside of a given threshold and determining, from the measuring, an AC voltage limit which will result in the current being outside of the given threshold.

5. The method of claim 4, further comprising:
    identifying which electrical equipment at an end of the leg of the cable communication network has gone offline; and
    performing one of:
        electrically connecting the identified equipment to an alternate power source; and
        replacing the network power supply with one which provides a higher level of AC voltage.

6. The method of claim 1, wherein performing a diagnosis comprises:
    setting, on the switched-mode power supply, a frequency of the AC voltage provided on the leg of the cable communication network at a given frequency which is different from a frequency which is used as a standard for the cable communication network;
    measuring a frequency of the AC voltage at various cable network access devices on the cable communication network; and
    determining that, when a frequency measured at a cable network access device is the same as the given frequency, the cable network access device belongs to the same leg of the cable communication network as the cable network access device at which the given frequency was set.

7. The method of claim 1, wherein performing a diagnosis comprises:
    determining that an AC voltage level is below a given threshold at the cable network access device; and
    using the switched-mode power supply to step up the AC voltage to a level such that electrical equipment electrically downstream from the cable network access device on the leg of the cable communication network will stay online and perform their intended function.

8. The method of claim 1, wherein performing a diagnosis comprises taking a reading of at least one of an AC voltage level, a current, and a frequency of the AC voltage.

9. The method of claim 8, wherein taking a reading is performed on the switched-mode power supply.

10. The method of claim 8, wherein taking a reading is performed on another device which is electrically connected to another cable network access device on the cable communication network.

11. A method for analyzing a performance of electrical equipment having a requirement for an AC power signal on a leg of a cable communication network which uses a network power supply as a power source therefor, the method using a switched-mode power supply and comprising:
    mechanically installing the electrical equipment on the leg of the cable communication network;
    electrically connecting an input of the switched-mode power supply to a portable battery providing a DC power source;
    the switched-mode power supply performing as an inverter to convert the DC power source to an AC power signal;
    prior to electrically connecting the electrical equipment to the network power supply, electrically connecting an AC output of the switched-mode power supply to the electrical equipment thereby providing an AC power signal to the electrical equipment; and
    performing a diagnosis of the performance of the electrical equipment while using the switched-mode power supply as the power source for the electrical equipment.

12. A switched-mode power supply device for connection to an outdoor cable network access device of a cable communication network for analyzing a performance of an AC power signal on a leg of the cable communication network which uses a network power supply as a power source therefor, the power supply device comprising:
- a power source connection for electrically connecting to an external electrical power source providing an input power signal which comprises either an alternating current (AC input signal) or a direct current (DC input signal);
- a programmable variable power output which:
  - when the input power signal comprises an AC input signal, converts the AC input signal to an AC output signal different from the AC input signal for output on the cable communication network;
  - when the input power signal comprises a DC input signal, inverts the DC input signal to an AC output signal for output on the cable communication network;
  - is electrically connected to an auxiliary power input of a cable network access device thereby providing an electrical connection of the switched-mode power supply device to the leg of the cable communication network and hence the AC output signal to the cable network access device; and
  - controls a characteristic of the AC output signal being provided to the leg of the cable communication network for performing a diagnosis of the performance of the AC power signal on the leg of the cable communication network.

13. The power supply device of claim 12, further comprising a sealed casing for sealingly receiving the power source connection and the programmable variable power output thereby preventing water or other contaminants from entering the sealed casing.

14. The power supply device of claim 13, further comprising an attachment member extending from the sealed casing and adapted to attach securely the power supply device to a cable near the outdoor cable network access device.

15. The power supply device of claim 14, further comprising a heat dissipation device mounted about the sealed casing for dissipating heat from the sealed casing.

16. The power supply device of claim 15, wherein the attachment member comprises a first attachment member upwardly extending from the sealed casing and a second attachment member distant from the first attachment member and upwardly extending from the sealed casing.

17. The power supply device of claim 16, wherein each one of the first and second attachment members comprises at least one of: a strap, a chain, a loop member and a hook portion.

18. The power supply device of claim 12, further comprising a current monitor for monitoring a current on the leg of the cable communication network.

19. The power supply device of claim 12, further comprising a frequency monitor for monitoring at least one of: the AC input signal, the DC input signal and the AC output signal.

20. The power supply device of claim 12, wherein the power supply device has a weight of less than 5 kg.

* * * * *